United States Patent
Ye et al.

(10) Patent No.: US 10,224,421 B2
(45) Date of Patent: Mar. 5, 2019

(54) SELF-ALIGNED PROCESS FOR SUB-10NM FIN FORMATION

(71) Applicant: Applied Materials, Inc., Santa Clara, CA (US)

(72) Inventors: Zhiyuan Ye, San Jose, CA (US); Xinyu Bao, Fremont, CA (US); Chun Yan, San Jose, CA (US); Hua Chung, San Jose, CA (US); Schubert S. Chu, San Francisco, CA (US); Satheesh Kuppurao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/933,072

(22) Filed: Mar. 22, 2018

(65) Prior Publication Data

US 2018/0277649 A1    Sep. 27, 2018

Related U.S. Application Data

(60) Provisional application No. 62/476,459, filed on Mar. 24, 2017.

(51) Int. Cl.
| | |
|---|---|
| *H01L 29/26* | (2006.01) |
| *H01L 21/8234* | (2006.01) |
| *H01L 29/66* | (2006.01) |
| *H01L 21/8252* | (2006.01) |
| *H01L 21/02* | (2006.01) |
| *H01L 21/311* | (2006.01) |
| *H01L 21/3105* | (2006.01) |
| *H01L 21/027* | (2006.01) |
| *H01L 21/67* | (2006.01) |

(52) U.S. Cl.
CPC .... *H01L 29/6681* (2013.01); *H01L 21/02636* (2013.01); *H01L 21/31053* (2013.01); *H01L 21/31116* (2013.01); *H01L 21/8252* (2013.01); *H01L 21/823431* (2013.01); *H01L 21/0274* (2013.01); *H01L 21/67167* (2013.01)

(58) Field of Classification Search
CPC combination set(s) only.
See application file for complete search history.

(56) References Cited

U.S. PATENT DOCUMENTS

| | | | |
|---|---|---|---|
| 9,679,994 B1 * | 6/2017 | Chou | H01L 29/66795 |
| 2018/0047575 A1 * | 2/2018 | Cheng | H01L 21/0337 |

* cited by examiner

*Primary Examiner* — Mamadou Diallo
(74) *Attorney, Agent, or Firm* — Patterson + Sheridan, LLP

(57) ABSTRACT

Methods of sub-10 nm fin formation are disclosed. One method includes patterning a first dielectric layer on a substrate to form one or more projections and a first plurality of spaces, and depositing a first plurality of columns in the first plurality of spaces. The first plurality of columns are separated by a second plurality of spaces. The method also includes depositing a second dielectric layer in the second plurality of spaces to form a plurality of dummy fins, removing the first plurality of columns to form a third plurality of spaces, depositing a second plurality of columns in the third plurality of spaces, removing the one or more projections and the plurality of dummy fins to form a fourth plurality of spaces, and depositing a plurality of fins in the fourth plurality of spaces. The plurality of fins have a width between 5-10 nm.

20 Claims, 5 Drawing Sheets

SELF-ALIGNED PROCESS FOR SUB-10NM FIN FORMATION

CROSS-REFERENCE TO RELATED APPLICATIONS

This application claims benefit of U.S. provisional patent application Ser. No. 62/476,459 filed Mar. 24, 2017, which is herein incorporated by reference in its entirety.

BACKGROUND

Field

Implementations described herein generally relate to methods of patterning a substrate. Specifically, implementations described herein relate to patterning sub-10 nm node structures.

Description of the Related Art

In response to an increased need for smaller electronic devices with denser circuits, devices with three dimensional (3D) structures, such as fin-shaped field effect transistors (FinFETs) have been developed. Forming sub-10 nm node structures is complicated by limitations and complexities associated with various patterning and lithography processes.

For example, multiple patterning processes, such as self-aligned double patterning (SADP) and self-aligned quadruple patterning (SAQP) processes, may not adequately provide reliable patterning given the small pitch size requirements associated with formation of sub-10 nm node structures. Other lithography processes, such as litho-etch-litho-etch (LELE) processes which utilize 193 nm immersion photolithography, are diffraction-limited, and the multiple litho-etch cycles may increase the line width roughness (LWR) of a resist used to pattern features on the substrate.

Conventional double and quadruple patterning schemes generally involve etching of a spacer material and removal of a mandrel material to leave a mask pattern created by individual spacers. However, conventional spacer etching processes often result in asymmetric spacer profiles and line edge roughness. Inconsistencies and asymmetries in spacer etching may affect pattern transfer which can result in adjacent features having inconsistent critical dimensions, depths, shapes, etc.

Accordingly, improved node formation methods are needed.

SUMMARY

The present disclosure relates to generally improved methods of sub-10 fin formation. One method includes patterning a first dielectric layer on a substrate to form one or more projections and a first plurality of spaces, and depositing a first plurality of columns in the first plurality of spaces. The first plurality of columns are separated by a second plurality of spaces. The method also includes depositing a second dielectric layer in the second plurality of spaces to form a plurality of dummy fins, removing the first plurality of columns to form a third plurality of spaces, depositing a second plurality of columns in the third plurality of spaces, removing the one or more projections and the plurality of dummy fins to form a fourth plurality of spaces, and depositing a plurality of fins in the fourth plurality of spaces. The plurality of fins have a width between 5-10 nm.

Another method includes depositing a first dielectric layer on a substrate, patterning the first dielectric layer to form one or more projections and a first plurality of spaces, and depositing a first plurality of columns in the first plurality of spaces. The first plurality of columns are separated by a second plurality of spaces. The method also includes depositing a second dielectric layer on the one or more projections in the second plurality of spaces to form a plurality of dummy fins, selectively removing the first plurality of columns to form a third plurality of spaces, depositing a second plurality of columns in the third plurality of spaces, selectively removing the one or more projections and the plurality of dummy fins to form a fourth plurality of spaces, depositing a plurality of fins in the fourth plurality of spaces. The plurality of fins have a width between 5-10 nm, and removing the second plurality of columns.

Yet another method includes depositing a first dielectric layer on a substrate, patterning the first dielectric layer to form one or more projections and a first plurality of spaces, and depositing a first plurality of columns in the first plurality of spaces. The first plurality of columns are separated by a second plurality of spaces. The method also includes planarizing the first plurality of columns, depositing a second dielectric layer on the one or more projections in the second plurality of spaces to form a plurality of dummy fins, selectively removing the first plurality of columns to form a third plurality of spaces, depositing a second plurality of columns in the third plurality of spaces, planarizing the first plurality of columns, selectively removing the one or more projections and the plurality of dummy fins to form a fourth plurality of spaces, and depositing a plurality of fins in the fourth plurality of spaces. The plurality of fins have a width between 5-10 nm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods of sub-10 fin formation. One method of forming fins includes patterning a first dielectric layer on a substrate to form one or more projections and a first plurality of spaces, and depositing a first plurality of columns in the first plurality of spaces. The first plurality of columns are separated by a second plurality of spaces. The method also includes depositing a second dielectric layer in the second plurality of spaces to form a plurality of dummy fins, removing the first plurality of columns to form a third plurality of spaces, depositing a second plurality of columns in the third plurality of spaces, removing the one or more projections and the plurality of dummy fins to form a fourth plurality of spaces, and depositing a plurality of fins in the fourth plurality of spaces. The plurality of fins have a width between 5-10 nm. By utilizing the different characteristics of type III-V semiconductor material to facilitate growth, a negative space template is made to grow type IV semiconductor sub-10 nm fins with the desired uniform straight side walls. The sub-10 nm fins have straight walls providing for more reliable performance.

Figure 1:
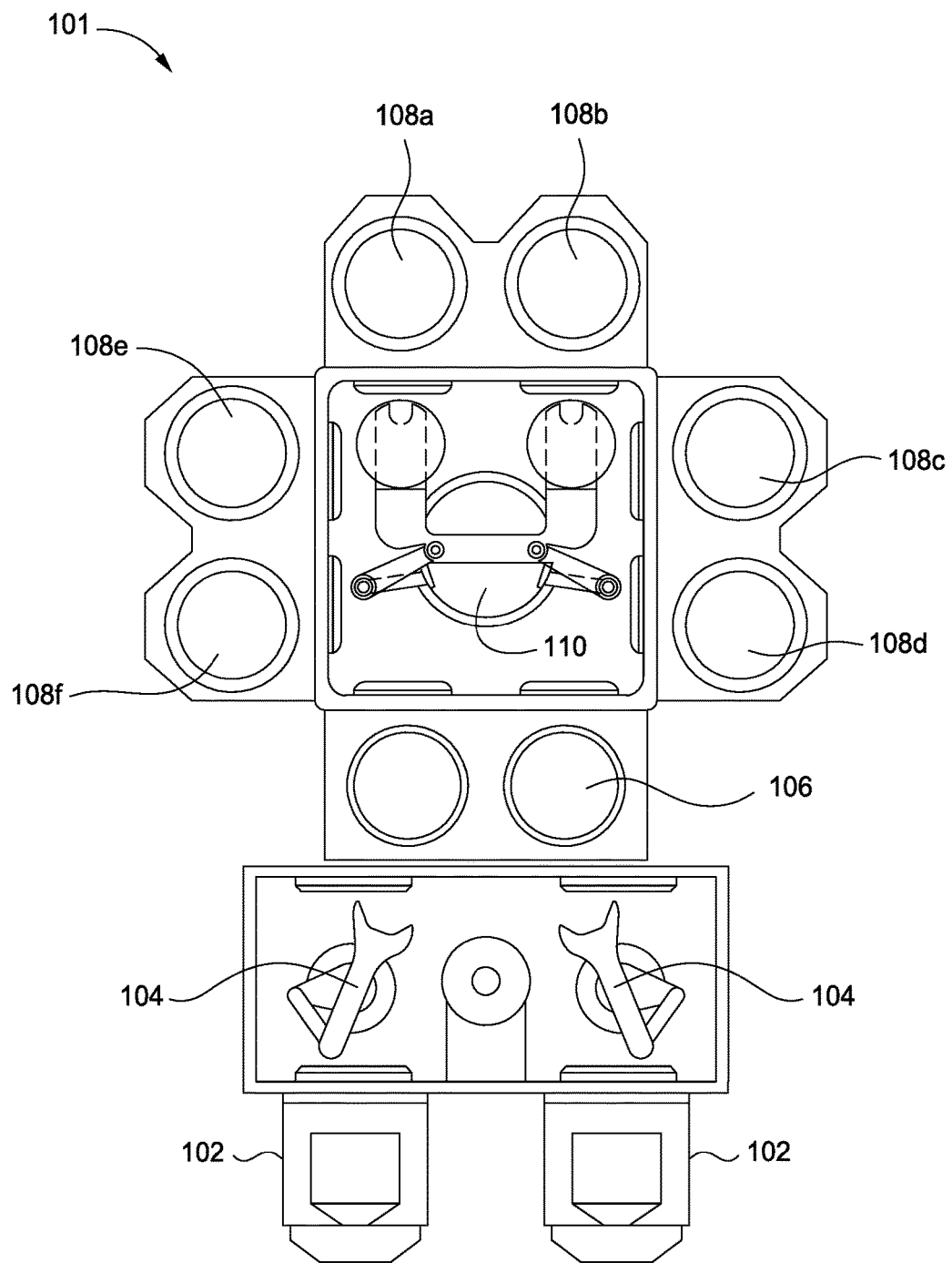
FIG. 1 illustrates a schematic, plan view of an exemplary processing system in which embodiments of the disclosure may be practiced.

FIG. 1 illustrates a schematic, plan view of a processing system 101 which may be utilized to perform the methods described herein. The processing system 101 may perform various processes, such as deposition processes, epitaxial growth processes, and baking and curing processes, among others. Examples of processing systems which may be utilized include the ENDURA® and PRODUCER® platforms, available from Applied Materials, Inc., Santa Clara, Calif. However, it is contemplated that suitably configured platforms from other manufacturers may be utilized in accordance with the embodiments described herein. The processing system 101 includes a pair of front opening unified pods (FOUPs) 102. Substrates are generally provided from the FOUPs 102. One or more first robots 104 retrieve the substrates from the front opening unified pods 102 and place the substrates into a loadlock chamber 106. One or more second robots 110 transport the substrates from the loadlock chamber 106 to one or more processing chambers 108a-108f (collectively processing chambers 108). Each of the processing chambers 108 may be configured to perform a number of substrate processing operations, such as plasma modification, ion implantation, plasma etching, epitaxial layer deposition, atomic layer deposition (ALD), chemical vapor deposition (CVD), physical vapor deposition (PVD), pre-clean, degas, orientation, and other substrate processes.

The substrate processing chambers 108 may include one or more system components for modifying and/or etching a material deposited on a substrate. Examples of substrate processing chambers which may be utilized include the RADION™ processing chamber available from Applied Materials, Inc., Santa Clara, Calif. However, it is contemplated that suitably configured processing chambers from other manufacturers may be utilized in accordance with the embodiments described herein. In one configuration, two pairs of the processing chambers, for example, 108c-108d and 108e-108f, may be used to modify a material on the substrate, and the third pair of processing chambers, for example, 108a-108b, may be used to remove material from the substrate. In another configuration, all of the processing chambers 108a-108f may be configured to modify a material on the substrate and remove material from the substrate. In this configuration, each pair of processing chambers, 108a-108b, 108c-108d, 108e-108f, may be configured to perform a plasma modification and/or ion implantation process and a selective etching process.

In one implementation, processing chambers configured to perform a selective etching process may utilize a dry plasma etching process to remove a previously modified material. Processing chambers configured to modify material or implant ions into a material, such as a spacer material, may utilize an inert plasma modification process. In one implementation, the processing chambers configured to modify material or implant ions may utilize an electron beam to form a plasma. However, other methods of forming a plasma may also be utilized. The processing system 101 described herein may be utilized to perform the processes described herein. Additionally, any one or more of the processes described herein may be performed in a chamber(s) separated from the processing system 101.

FIGS. 2A-2K illustrate a partial cross-sectional view of a substrate 202 node formation according to the method described herein. FIG. 3 illustrates a flow diagram of a method 300 for processing a substrate according to embodiments described herein. The method 300 begins at operation 310 by depositing a first dielectric material 204 on a substrate 202. The dielectric material 204 is deposited on the substrate 202 to form a stack 200. Any suitable CVD process for depositing a dielectric may be used. The substrate 202 may be formed from suitable materials, such as semiconductor materials, oxide materials, and the like. In one example, the substrate 202 may be a silicon oxide or silicon nitride containing material. In other implementations, the substrate 202 may be a material layer, such as an etch stop layer, disposed on a substrate. The substrate 202 may be doped to form a p-type or a n-type substrate. Such dopants include zinc, tellurium, boron, etc. The dielectric material 204 may be formed from suitable silicon materials such as silicon germanium, polysilicon, silicon dioxide, or silicon nitride. The dielectric material 204 may be between 5-50 nm thick.

Figure 2A:
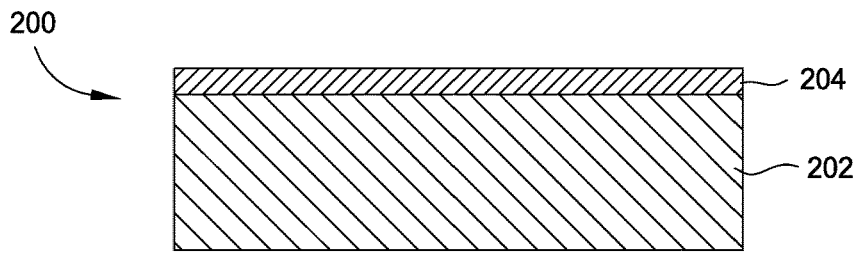
FIGS. 2A-2K illustrates a partial cross-sectional view of a substrate fin formation according to one embodiment described herein.
Figure 2B:
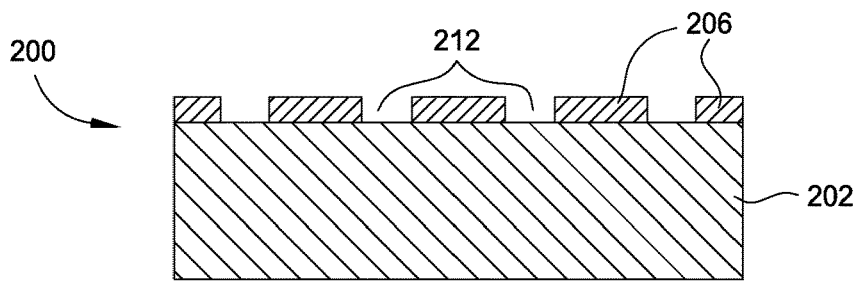
Figure 3:
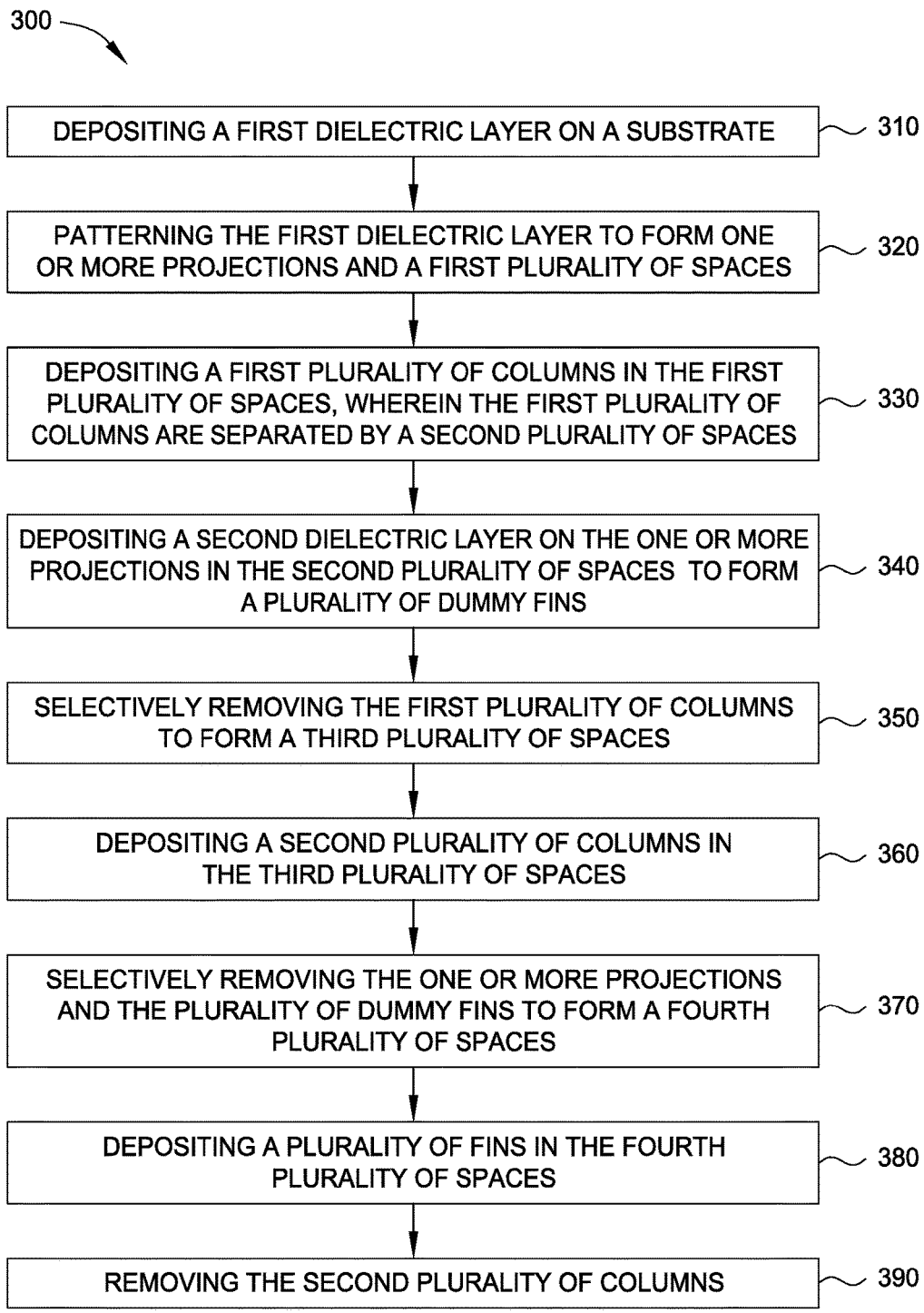
FIG. 3 illustrates a flow diagram of a method for processing a substrate according to embodiments described herein.

At operation 320, the dielectric material 204 is patterned, as seen in FIG. 2B, to form one or more projections 206. The patterning may be accomplished using a photolithographic masking process. The patterning includes removing dielectric material 204 to form the projections 206 and exposing the substrate 202. The projections 206 may have various shapes including square, circular, hexagonal, rectangular, triangular, etc. One or more spaces or gaps 212 separate each of the projections 206. The one or more spaces 212 expose the substrate 202.

Figure 2C:
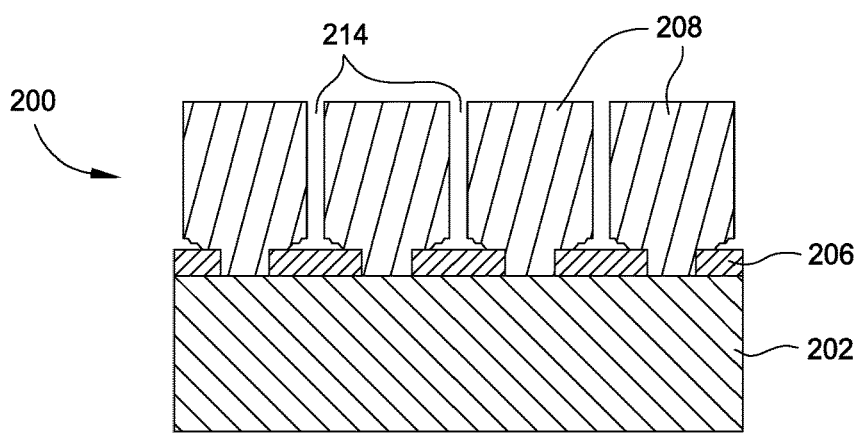

At operation 330, one or more columns 208 are deposited in the one or more spaces 212. A selective epitaxial growth is performed to form the one or more columns 208. As seen in FIG. 2C, the one or more columns 208 are grown on the substrate 202 between the projections 206 and within the one or more spaces 212. The projections 206 may be formed from various materials, including silicon containing materials, III-V materials, or the like. For example, the columns 208 may be formed from gallium arsenide, aluminum phosphide, gallium phosphide, boron arsenide, boron nitride, indium nitride, and other III-V semiconductor materials. In one embodiment, the selective epitaxial growth of the III-V materials is performed at a pressure of between 40 torr to 600 torr, at a temperature of between 300 C to 450 C. In one embodiment, the columns are grown to a thickness of between 10 to 100 nm. During the growth TMGa is flowed format a rate between 2 to 100 sccm, such as 5 to 50 sccm, for example 20 sccm, and TBAs is flowed format a rate between 10 to 300 sccm to maintain a ratio of group V precursor flow rate to group III precursor flow rate (V/IIII ratio) of between 2:100. In one embodiment, the flow rate for TMGa is between 5 to 20 sccm and for TBAs is between 50 to 200 sccm for a V/III ratio of between 5:1 to 20:1.

The columns 208 are separated by one or more spaces 214. The one or more spaces 214 are between 5 nm-10 nm in width. In one implementation, the side wall of one column is separated from the side wall of an adjacent column by a distance of between 5 nm-10 nm. The columns 208 have substantially straight or vertical side walls. The growth of the columns 208 is selective. The deposition on the upper surface of the columns 208 is energetically favored by the crystal structure of the growing columns 208, such that the sides of the columns 208 remain straight and smooth as the columns 208 grow vertically. Additionally, the growth of the columns 208 may be precisely controlled using the epitaxial growth conditions to achieve a desired pitch. In one embodiment, the sidewall of the pillar is faceted using atomic layer roughness. In one embodiment, the growth condition result in a side wall growth of the 110 direction that is slower than the vertical growth 100. In one embodiment, the temperature is between about 400° C. to about 650° C., the pressure is between about 10 torr to about 80 torr, and the V/III material ratio is about 1:100. The columns 208 may have a height of between 80-230 nm and a width of between 100-130 nm. The columns 208 may have various heights following the epitaxial growth. A chemical mechanical polishing may be performed on the columns 208 to planarize the top surface of each column 208 and make the columns 208 uniform in height, as shown in FIG. 2C.

Figure 2D:
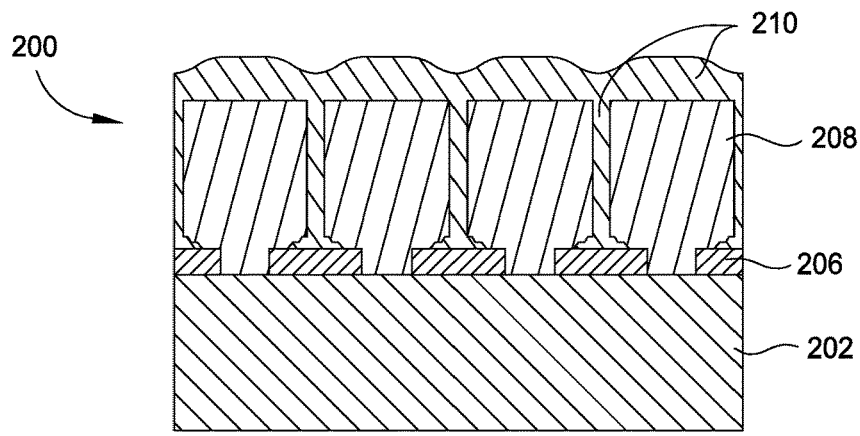
Figure 2E:
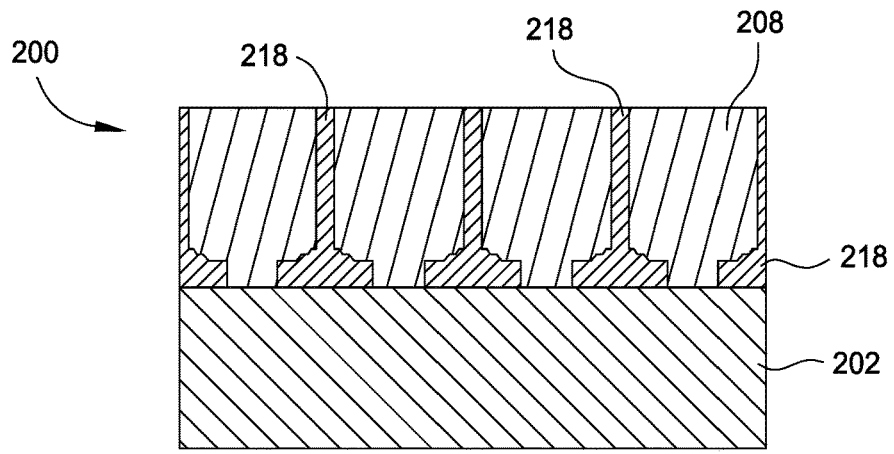

At operation 340, a second dielectric material 210 is deposited, as seen in FIG. 2D. The second dielectric material 210 is deposited in the one or more spaces 214 between the one or more columns 208. The second dielectric material 210 is deposited on the each of the projections 206. The second dielectric material 210 surrounds each of the columns 208. The second dielectric material 210 extends above the one or more columns 208 and is disposed on the top surface of each column 208. In one implementation the second dielectric material 210 is the same as the first dielectric material 204. In another implementation, the second dielectric material 210 is different than the first dielectric material 204. The second dielectric material 210 may be formed from suitable silicon materials such as silicon germanium, polysilicon, silicon dioxide, or silicon nitride. The stack 200 is planarized, as seen in FIG. 2E. A portion of the second dielectric material 210 is removed to expose the one or more columns 208 and form a plurality of dummy fins 218 between the one or more columns 208.

Figure 2F:
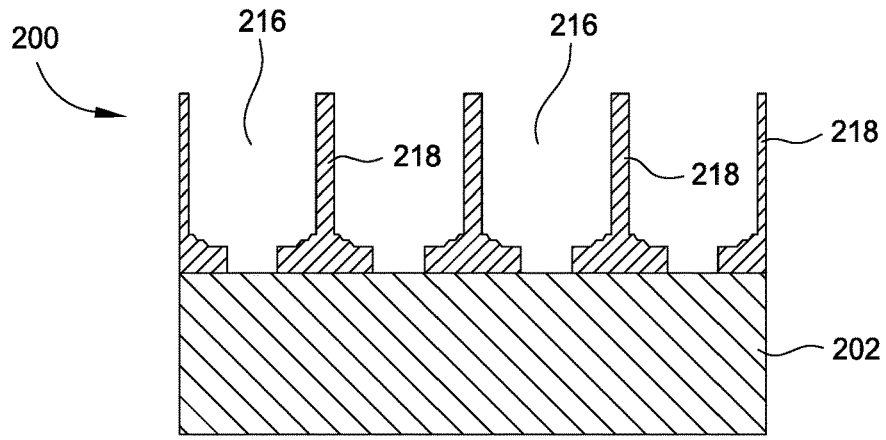

At operation 350, the one or more columns 208 are selectively removed. In one embodiment, a selective etching process may utilize a known dry plasma etching process to remove the one or more columns 208. It is contemplated that the materials selected for the one or more columns 208 and the plurality of dummy fins 218 may have different characteristics to facilitate selective etching processes. As seen in FIG. 2F, the removal of the columns 208 leaves the plurality of spaces 216. The plurality of dummy fins 218 are separated by the one or more spaces 216.

Figure 2G:
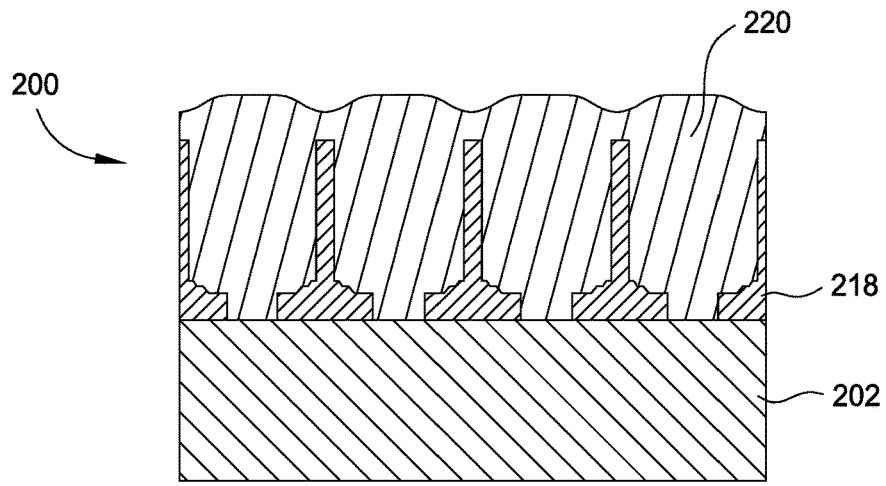
Figure 2H:
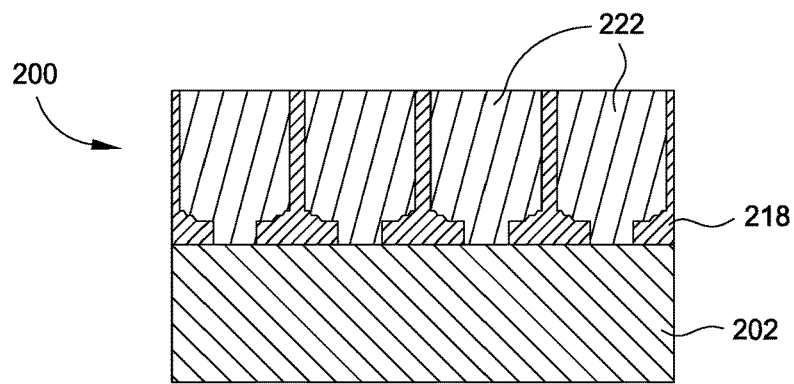

At operation 360, a plurality of dummy columns 222 is deposited. A third dielectric material 220 is deposited into the one or more spaces 216 to form the plurality of dummy columns 222, as seen in FIG. 2G. The third dielectric material 220 is different than the first dielectric material 204. The third dielectric material 220 is different than the second dielectric material 210. The third dielectric material 220 may be formed from suitable silicon materials, nitride containing materials, and the like. In certain implementations, the third dielectric material 220 may be a silicon germanium material, polysilicon material, silicon dioxide material, or silicon nitride material. The dummy columns 222 are planarized using CMP to expose the plurality of dummy fins 218, as seen in FIG. 2H.

At operation 370, the dummy fins 218 and the one or more projections 206 are removed. The plurality of dummy fins 218 and the one or more projections 206 are selectively removed exposing the substrate 202. In one embodiment, a selective etching process may utilize a dry plasma etching process to remove the plurality of dummy fins 218 and the one or more projections 206. It is contemplated that the materials selected for the plurality of dummy fins 218 and the one or more projections 206 have different characteristics than the dummy columns 222 to facilitate selective etching processes.

Figure 2I:
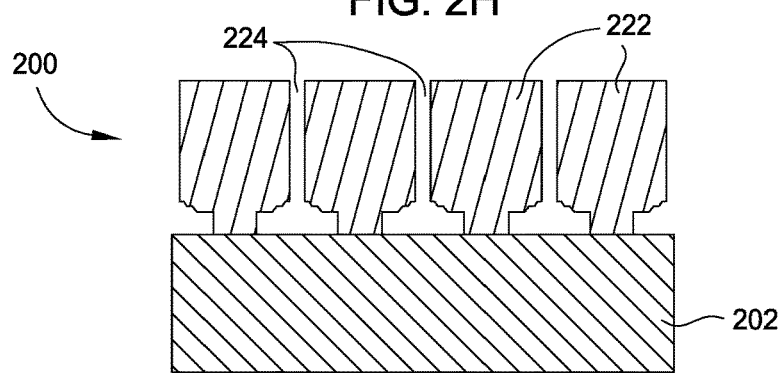
Figure 2J:
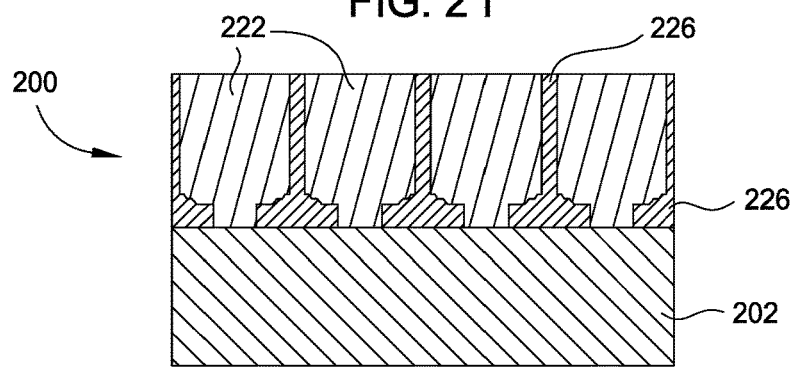

As seen in FIG. 2I, the dummy columns 222 are separated by a plurality of spaces 224. The plurality of spaces 224 are between the dummy columns 222. The plurality of spaces 224 form a template for fin formation growth on the substrate 202 with substantially straight walls. At operation 380, one or more fins 226 are deposited. The one or more sub-10 nm fins 226 are selectively grown within the plurality of spaces 224, as seen in FIG. 2J. The fins 226 have substantially straight walls. The fins 226 may be a group IV semiconductor material. In certain implementations, the fins 226 may be formed from silicon germanium, silicon, silicon carbide, and other IV semiconductor materials. The fins 226 have a width between 6-10 nm. By selectively growing the fins 226 within the plurality of spaces 224, the fins advantageously have straight walls providing for uniform current flow from the top of the fin to the bottom of the fin.

Figure 2K:
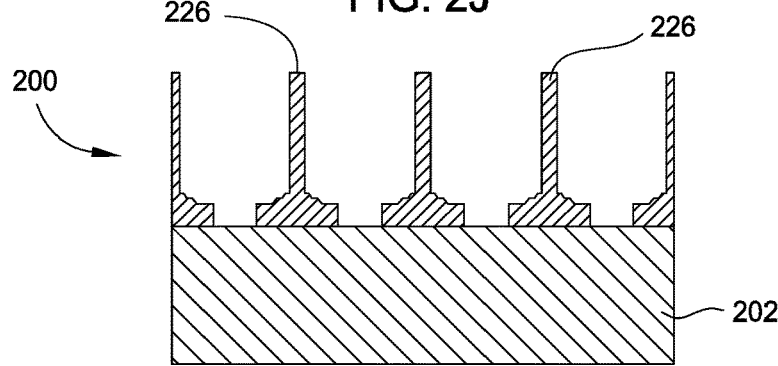

At operation 390, the dummy columns 222 are removed. The dummy columns 222 may be selectively removed, as seen in FIG. 2K, providing for subsequent processing in the fabrication of FinFET structures. The stack 200 includes a substrate 202 and one or more fins 226 on the substrate 202. The fins 226 have a wide base that narrows into substantially straight walls. In other words, the width at the top of walls of the fins 226 is substantially the same as the width at the bottom of the walls of the fins 226. The width of the fins 226 may be between 6-10 nm.

By utilizing the different characteristics of type III-V semiconductor material to facilitate growth, a negative space template is made to then grow type IV semiconductor sub-10 nm fins with the desired uniform straight side walls. The sub-10 nm fins advantageously have straight walls providing for uniform current flow.

While the foregoing is directed to embodiments of the present invention, other and further embodiments of the invention may be devised without departing from the basic scope thereof, and the scope thereof is determined by the claims that follow.

The invention claimed is:
1. A method, comprising:
patterning a first dielectric layer on a substrate to form one or more projections and a first plurality of spaces;
depositing a first plurality of columns in the first plurality of spaces, wherein the first plurality of columns are separated by a second plurality of spaces;
depositing a second dielectric layer in the second plurality of spaces to form a plurality of dummy fins;
removing the first plurality of columns to form a third plurality of spaces;
depositing a second plurality of columns in the third plurality of spaces;
removing the one or more projections and the plurality of dummy fins to form a fourth plurality of spaces; and depositing a plurality of fins in the fourth plurality of spaces, wherein the plurality of fins have a width between 5-10 nm.

2. The method of claim 1, wherein the first dielectric layer is silicon germanium, polysilicon, silicon dioxide, or silicon nitride.

3. The method of claim 1, wherein the first dielectric layer is between about 5-50 nm thick.

4. The method of claim 1, wherein each of the first plurality of columns is a type III-V semiconductor material.

5. The method of claim 1, wherein each of the plurality of fins is a type IV semiconductor material.

6. The method of claim 1, wherein each of the second plurality of columns is silicon germanium, polysilicon, silicon dioxide, or silicon nitride.

7. The method of claim 1, wherein the second plurality of spaces is between 6-10 nm.

8. A method, comprising:
depositing a first dielectric layer on a substrate;
patterning the first dielectric layer to form one or more projections and a first plurality of spaces;
depositing a first plurality of columns in the first plurality of spaces, wherein the first plurality of columns are separated by a second plurality of spaces;
depositing a second dielectric layer on the one or more projections in the second plurality of spaces to form a plurality of dummy fins;
selectively removing the first plurality of columns to form a third plurality of spaces;
depositing a second plurality of columns in the third plurality of spaces;
selectively removing the one or more projections and the plurality of dummy fins to form a fourth plurality of spaces;
depositing a plurality of fins in the fourth plurality of spaces, wherein the plurality of fins have a width between 5-10 nm; and
removing the second plurality of columns.

9. The method of claim 8, wherein the first dielectric layer is silicon germanium, polysilicon, silicon dioxide, or silicon nitride.

10. The method of claim 8, wherein the first dielectric layer is between about 5-50 nm thick.

11. The method of claim 8, wherein each of the first plurality of columns is a type III-V semiconductor material.

12. The method of claim 8, wherein each of the plurality of fins is a type IV semiconductor material.

13. The method of claim 8, wherein each of the second plurality of columns is silicon germanium, polysilicon, silicon dioxide, or silicon nitride.

14. The method of claim 8, wherein each of the second plurality of spaces is between 6-10 nm.

15. A method, comprising:
depositing a first dielectric layer on a substrate;
patterning the first dielectric layer to form one or more projections and a first plurality of spaces;
depositing a first plurality of columns in the first plurality of spaces, wherein the first plurality of columns are separated by a second plurality of spaces;
planarizing the first plurality of columns;
depositing a second dielectric layer on the one or more projections in the second plurality of spaces to form a plurality of dummy fins;
selectively removing the first plurality of columns to form a third plurality of spaces;
depositing a second plurality of columns in the third plurality of spaces;
planarizing the first plurality of columns;
selectively removing the one or more projections and the plurality of dummy fins to form a fourth plurality of spaces; and
depositing a plurality of fins in the fourth plurality of spaces, wherein the plurality of fins have a width between 5-10 nm.

16. The method of claim 15, wherein the first dielectric layer is silicon germanium, polysilicon, silicon dioxide, or silicon nitride.

17. The method of claim 15, wherein the first dielectric layer is between about 5-50 nm thick.

18. The method of claim 15, wherein each of the first plurality of columns is a type III-V semiconductor material.

19. The method of claim 15, wherein each of the plurality of fins is a type IV semiconductor material.

20. The method of claim 15, wherein each of the second plurality of spaces is between 6-10 nm.

* * * * *